US010049696B2

(12) United States Patent
Tokunaga et al.

(10) Patent No.: US 10,049,696 B2
(45) Date of Patent: Aug. 14, 2018

(54) OPTICAL RECORDING MEDIUM PRODUCTION DEVICE AND PRODUCTION METHOD

(71) Applicant: Panasonic Intellectual Property Management Co., Ltd., Osaka (JP)

(72) Inventors: Yuuki Tokunaga, Okayama (JP); Takehiko Toyota, Okayama (JP); Tatsuyuki Harada, Okayama (JP)

(73) Assignee: Panasonic Intellectual Property Management Co. Ltd., Osaka (JP)

(*) Notice: Subject to any disclaimer, the term of this patent is extended or adjusted under 35 U.S.C. 154(b) by 354 days.

(21) Appl. No.: 15/076,755

(22) Filed: Mar. 22, 2016

(65) Prior Publication Data

US 2016/0203840 A1    Jul. 14, 2016

Related U.S. Application Data

(62) Division of application No. 13/824,001, filed as application No. PCT/JP2011/003085 on Jun. 1, 2011, now Pat. No. 9,324,357.

(30) Foreign Application Priority Data

Oct. 7, 2010  (JP) ................. 2010-227100

(51) Int. Cl.
*B08B 5/02* (2006.01)
*G11B 7/26* (2006.01)
(Continued)

(52) U.S. Cl.
CPC ............ *G11B 7/266* (2013.01); *B08B 5/02* (2013.01); *B08B 5/04* (2013.01); *C23C 14/34* (2013.01); *G11B 7/265* (2013.01)

(58) Field of Classification Search
CPC .. B08B 5/02; B08B 5/04; G11B 7/265; G11B 7/266
(Continued)

(56) References Cited

U.S. PATENT DOCUMENTS 4,726,006 A    2/1988  Benne et al.
4,747,093 A    5/1988  Benne et al.
(Continued)

FOREIGN PATENT DOCUMENTS

CN    86 1 02890    10/1986
CN    1263342    8/2000
(Continued)

OTHER PUBLICATIONS

International Search Report (ISR) dated Jul. 5, 2011 in International (PCT) Application No. PCT/JP2011/003085.
(Continued)

*Primary Examiner* — Rodney Glenn McDonald
(74) *Attorney, Agent, or Firm* — Wenderoth, Lind & Ponack, L.L.P.

(57) ABSTRACT

A recording medium production device includes a substrate positioning pin vertically movable that performs positioning to a center-hole of a substrate; a substrate holding portion that performs positioning of substrate using the substrate positioning pin to hold the substrate; a cleaner having a gas ejection portion that ejects gas toward the surface of the substrate held by the substrate holding portion, and a gas suction portion that suctions gas; and a substrate positioning pin fixing portion that can press the substrate positioning pin downward. The fixing portion is configured so as not to contact an inner circumferential side surface of the center-hole of substrate. The substrate positioning pin fixing portion descends inside the center-hole of substrate held by the (Continued)

substrate, and presses and fixes the substrate positioning pin. Then the cleaner performs ejection and suction of gas.

6 Claims, 9 Drawing Sheets

(51) Int. Cl.
*B08B 5/04* (2006.01)
*C23C 14/34* (2006.01)

(58) Field of Classification Search
USPC .............. 204/192.1–192.38; 15/345, 300.1; 427/129
See application file for complete search history.

(56) References Cited

U.S. PATENT DOCUMENTS

| | | |
|---|---|---|
| 6,478,069 B1 | 11/2002 | Fujisaku et al. |
| 6,746,564 B2 | 6/2004 | Fujisaku et al. |
| 2003/0051822 A1 | 3/2003 | Fujisaku et al. |
| 2004/0149111 A1 | 8/2004 | Ide et al. |
| 2004/0149115 A1 | 8/2004 | Ide et al. |
| 2005/0046058 A1 | 3/2005 | Suwa et al. |

FOREIGN PATENT DOCUMENTS

| | | |
|---|---|---|
| EP | 1 562 189 | 8/2005 |
| JP | 63-167447 | 7/1988 |
| JP | 9-81974 | 3/1997 |
| JP | 2000-107715 | 4/2000 |
| JP | 2001-156033 | 6/2001 |
| JP | 2001-338443 | 12/2001 |
| JP | 2004-227673 | 8/2004 |
| JP | 2006-269001 | 10/2006 |

OTHER PUBLICATIONS

International Preliminary Report on Patentability and Written Opinion, in the English language, dated Apr. 18, 2013, in International Application No. PCT/JP2011/003085.
Chinese Office Action (OA) and Search Report (SR) dated Apr. 3, 2015 in corresponding Chinese Patent Application No. 201180048161.2, together with English translations thereof.
Extended European Search Report dated Sep. 18, 2015 in corresponding European Application No. 11830304.9.

OPTICAL RECORDING MEDIUM PRODUCTION DEVICE AND PRODUCTION METHOD

TECHNICAL FIELD

The present disclosure relates to an optical recording medium production device and a production method thereof, and particularly to a production device and a production method that removes a foreign material on a substrate of an optical recording medium.

BACKGROUND ART

As a conventional method for removing a foreign material in an information signal layer of an optical recording medium, there is a method having a process of spraying gas onto at least an exposed surface of the information signal layer of a substrate and suctioning the gas in the vicinity of the exposed surface after a process of forming the information signal layer and before a process of forming a light transmissive layer (e.g., refer to Patent Literature 1).

PRIOR ART DOCUMENT

Patent Document

Patent Literature 1: JP 2001-338443 A

However, in the device that carries out the above-described method for removing the foreign material, since a neighborhood of an inner circumferential side surface of a center hole of the optical recording medium is in contact with a substrate positioning pin, even if the gas is sprayed and suctioned, the foreign material cannot be removed sufficiently.

The present disclosure is to solve the above-described problem. The present disclosure provides an optical recording medium production device and a production method thereof capable of sufficiently removing a foreign material near an inner circumferential side surface of a center hole of an optical recording medium.

SUMMARY OF THE INVENTION

In order to solve the above-described problem, an optical recording medium production device of the present disclosure is an optical recording medium production device in which an information signal layer is provided on a substrate, includes:

a substrate positioning pin vertically movable that performs positioning to a center hole of the substrate;

a substrate holding portion that performs the positioning of the substrate using the substrate positioning pin to hold the substrate;

a cleaner having a gas ejection portion that ejects gas toward a surface of the substrate held by the substrate holding portion, and a gas suction portion that suctions the gas; and a substrate positioning pin fixing portion that can press the substrate positioning pin downward, and is configured so as not to come into contact with an inner circumferential side surface of the center hole of the substrate;

wherein the substrate positioning pin fixing portion descends inside the center hole of the substrate held by the substrate holding portion so as to form a gap in the vicinity of the inner circumferential side surface of the center hole of the substrate, and presses and fixes the substrate positioning pin, and in the state, the cleaner performs the ejection and suction of the gas.

Moreover, in order to solve the above-described problem, an optical recording medium production method of the present disclosure includes the steps of:

holding a substrate positioned by a substrate positioning pin vertically movable to a center hole of the substrate;

pressing the substrate positioning pin downward and fixing the same so as to expose an inner circumferential side surface of the center hole of the substrate; and removing a foreign material by a cleaner that ejects gas toward a surface of the held substrate and simultaneously suctions the gas.

Effect of the Invention

According to the present disclosure, the optical recording medium production device and the production method thereof can be realized, in which the surface of the inner circumferential side surface of the center hole of the optical recording medium is exposed during the cleaner operation, by which the foreign material near the inner circumferential side surface of the center hole of the optical recording medium can be removed sufficiently.

DETAILED DESCRIPTION OF THE INVENTION

Figure 1:
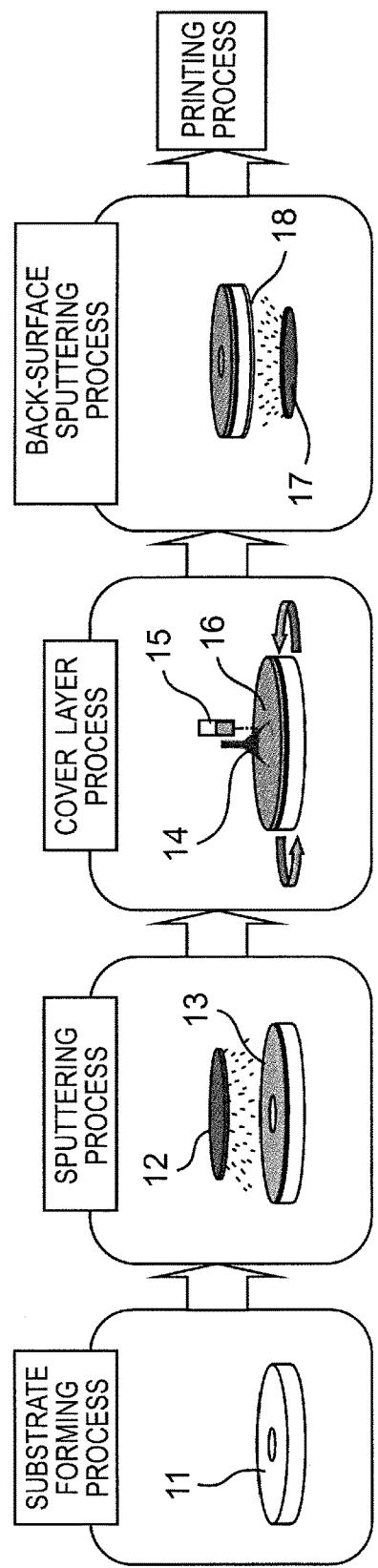
FIG. 1 is a view schematically showing an overall process of production of a disk-shaped optical recording medium.

Hereinafter, referring to the drawings, embodiments of the present disclosure will be described.

1. First Embodiment

1.1 Production Process of Optical Recording Medium

First, an overall process of production of a disk-shaped optical recording medium will be described. FIG. 1 is a view schematically showing an overall process of the production of the disk-shaped optical recording medium. The optical recording medium produced by a production method described below is a disk-shaped recording medium in which an information signal layer is provided on a substrate, and the substrate is irradiated with light to perform recording and/or reproduction of an information signal. As shown in FIG. 1, the overall process of the production of the disk-shaped optical recording medium includes a substrate forming process, a sputtering process, a cover layer process, a back-surface sputtering process, and a printing process, and the respective processes are performed in this order.

First, in the substrate forming process, for example, a disk-shaped polycarbonate substrate 11 having a thickness 1.1 mm is formed. Next, in the sputtering process, a target material 12 is sputtered on a signal surface 13 of the substrate 11 to thereby form a recording film and/or a reflection film.

Next, in the cover layer process, in order to protect a surface of the signal surface 13, a cover layer is formed. Specifically, in this cover layer process, an ultraviolet curable resin 16 is applied by a resin dropping nozzle 15 onto a center cap 14 arranged above a central portion of the substrate 11, and further, the applied resin is spread so as to have a uniform thickness on the substrate surface, for example, by a spin coating method, and is then cured by ultraviolet rays. Thereby, the cover layer is formed.

Next, in the back-surface sputtering process, in order to prevent warpage of the substrate due to water absorption, on the opposite side of the substrate surface with the cover layer formed, a back-surface sputtering target material 17 is sputtered, by which the water absorption preventing film 18 is formed. Finally, in the printing process, label printing is performed on the surface with the water absorption preventing film 18 formed in the back-surface sputtering process.

In the present embodiment, in the overall process of the production of the disk-shaped optical recording medium, a foreign material removal sub-process for removing a foreign material such as dust is performed before any one of the above-described sputtering process, cover layer process, back-surface sputtering process, and printing process. Particularly in the cover layer process, since occurrence of a defective recording medium due to foreign material contamination largely deteriorates a yield ratio in the cover layer process, the foreign material removal of the substrate surface before applying the ultraviolet curable resin 16 is very important.

1.1 Configuration of Optical Recording Medium Production Device

Figure 2:
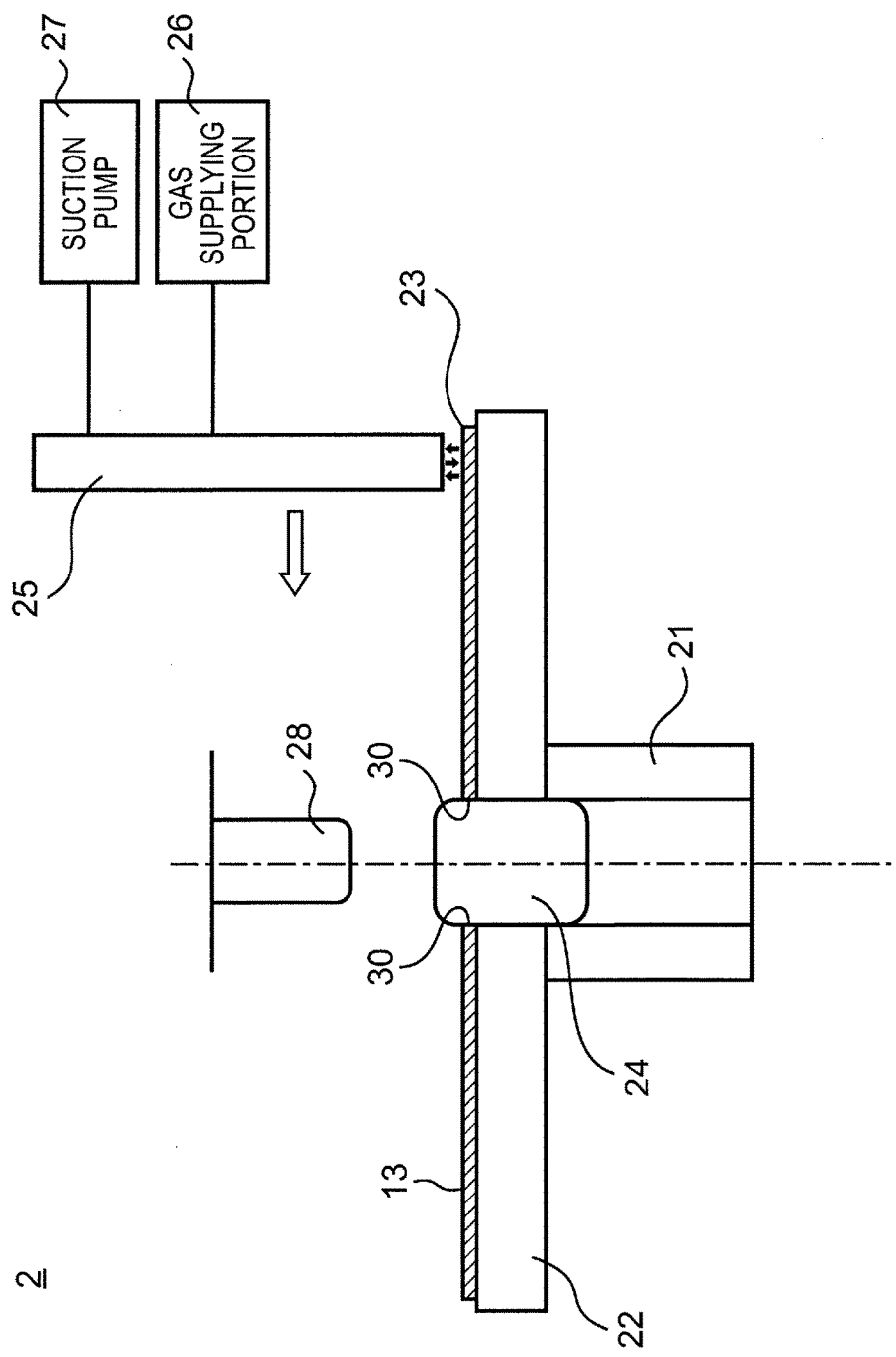
FIG. 2 is a view showing a schematic configuration of an optical recording medium production device to remove a foreign material, according to First Embodiment of the present disclosure.

Next, a production device 2 according to First Embodiment of the present disclosure will be described. FIG. 2 is a view showing a schematic configuration of the optical recording medium production device 2 to remove a foreign material, according to the present embodiment. In the following description, the configuration of the production device 2 when the foreign material of the recording medium is removed immediately before the cover layer process is described, and in the production device 2, a substrate 23 after the recording layer and/or the reflection film is formed by sputtering is arranged.

The optical recording medium production device 2 of the present embodiment includes a rotary shaft 21, a substrate holding portion 22, a substrate positioning pin 24, a substrate positioning pin fixing portion 28, a cleaner nozzle 25, a gas supplying portion 26, and a suction pump 27. In FIG. 2, the rotary shaft 21, the substrate holding portion 22, the substrate positioning pin 24, and the substrate positioning pin fixing portion 28 are shown in a vertical cross-sectional view.

The disk-shaped substrate 23, which is a base of the optical recording medium, is held by the substrate holding portion 22 moving in tandem with the rotary shaft 21 rotating at a high speed. The substrate holding portion 22 holds the substrate 23 by an action such as vacuum suction and the like.

As shown in FIG. 2, in a vertical direction in central portions of the rotary shaft 21 and the substrate holding portion 22, a cylindrical hole having the same diameter as a diameter of a center hole of the substrate 23 is provided. Inside this cylindrical hole, the columnar substrate positioning pin 24 is arranged. While the substrate positioning pin 24 is arranged without any gap inside the cylindrical hole of the rotary shaft 21 and the substrate holding portion 22, it is configured operably in a direction perpendicular to the signal surface 13 of the substrate 23. This substrate positioning pin 24 is provided to position the substrate 23 on the substrate holding portion 22. That is, the substrate positioning pin 24 is biased from below by an elastic body (not shown) such as a spring so as to slightly protrude an upper surface thereof from the signal surface 13 of the substrate 23 when positioning the substrate 23, and so as to lower a vertical position inside the cylindrical hole when pressing the upper surface downward.

The substrate positioning pin fixing portion 28 is provided at a position corresponding to the substrate positioning pin 24 above the substrate positioning pin 24. The substrate positioning pin fixing portion 28 vertically descends to be fixed in the state pressing the substrate positioning pin 24. That is, the substrate positioning pin 24 and the substrate positioning pin fixing portion 28 are fixed to each other in contact. By fixing them to each other in this manner, each of contact surfaces between the substrate positioning pin 24 and the substrate positioning pin fixing portion 28 is not worn even when the rotary shaft 21 and the substrate holding portion 22 rotate, and thus, occurrence of a foreign material during rotary motion of the rotary shaft 21 and the substrate holding portion 22 can be suppressed. Therefore, both the substrate positioning pin 24 and the substrate positioning pin fixing portion 28 are preferably made of magnetic field generating bodies such as magnets. Alternatively, one of the substrate positioning pin 24 and the substrate positioning pin fixing portion 28 may be made of the magnetic field generating body such as a magnet, and the other may be made of a magnetic body.

As described later, when the substrate positioning pin fixing portion 28 presses the substrate positioning pin 24, a gap (space) is preferably formed inside an inner circumferential side surface 30 of the center hole of the substrate 23, that is, a surface of the inner circumferential side surface 30 is preferably exposed. That is, at this time, preferably, the substrate positioning pin fixing portion 28 does not come into contact with the inner circumferential side surface 30 of the center hole of the substrate 23. For this, a lateral width of the substrate positioning pin fixing portion 28 is preferably smaller than a diameter of a circular cross section of the substrate positioning pin 24. Specifically, preferably, for example, the substrate positioning pin fixing portion 28 has a columnar shape, and a diameter of a circular cross section thereof is smaller than the diameter of the circular cross section of the substrate positioning pin 24.

Furthermore, the cleaner nozzle 25 is provided in opposition to the signal surface 13 of the substrate 23. The cleaner nozzle 25 performs the ejection of gas and the suction of the gas at a forefront portion thereof in order to remove the foreign material. Accordingly, as shown in FIG. 2, the forefront portion of the cleaner nozzle 25 is arranged in opposition to the signal surface 13 of the substrate 23 and at a distance of several millimeters from the signal surface 13 of the substrate 23. Furthermore, in the present embodiment, the forefront portion of the cleaner nozzle 25 is configured movably on a parallel plane at a distance of several millimeters from the signal surface 13 of the substrate 23, from a center hole vicinity of the substrate 23 to an outer circumferential vicinity, or from the outer circumferential vicinity of the substrate 23 to the center hole vicinity in a radial direction of the substrate 23. As described later, preferably, when the forefront portion of the cleaner nozzle 25 exists in the center hole vicinity of the substrate 23, the forefront portion approaches a portion slightly closer to a center of the center hole than the inner circumferential side surface 30 of the center hole of the substrate 23.

Figure 3:
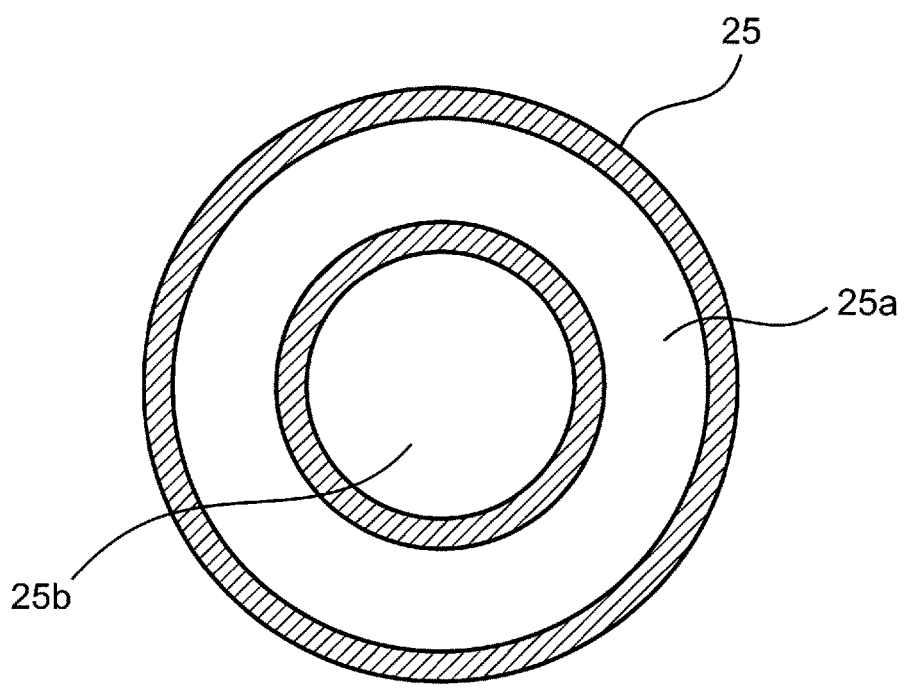
FIG. 3 is a horizontal cross-sectional view of a forefront portion of a cleaner nozzle.

FIG. 3 is a horizontal cross-section of the forefront portion of the cleaner nozzle 25. In the cleaner nozzle 25, a gas ejection nozzle 25b to perform gas ejection is provided, and a gas suction nozzle 25a to perform suction of the gas is provided so as to surround the gas ejection nozzle. A gas supply portion 26 shown in FIG. 2 supplies the high-pressure gas to a surface of the substrate 23 through the gas ejection nozzle 25b of the cleaner nozzle 25. The suction pump 27 suctions the gas through the gas suction nozzle 25a of the cleaner nozzle 25.

1.2. Operation of Optical Recording Medium Production Device

Figure 4:
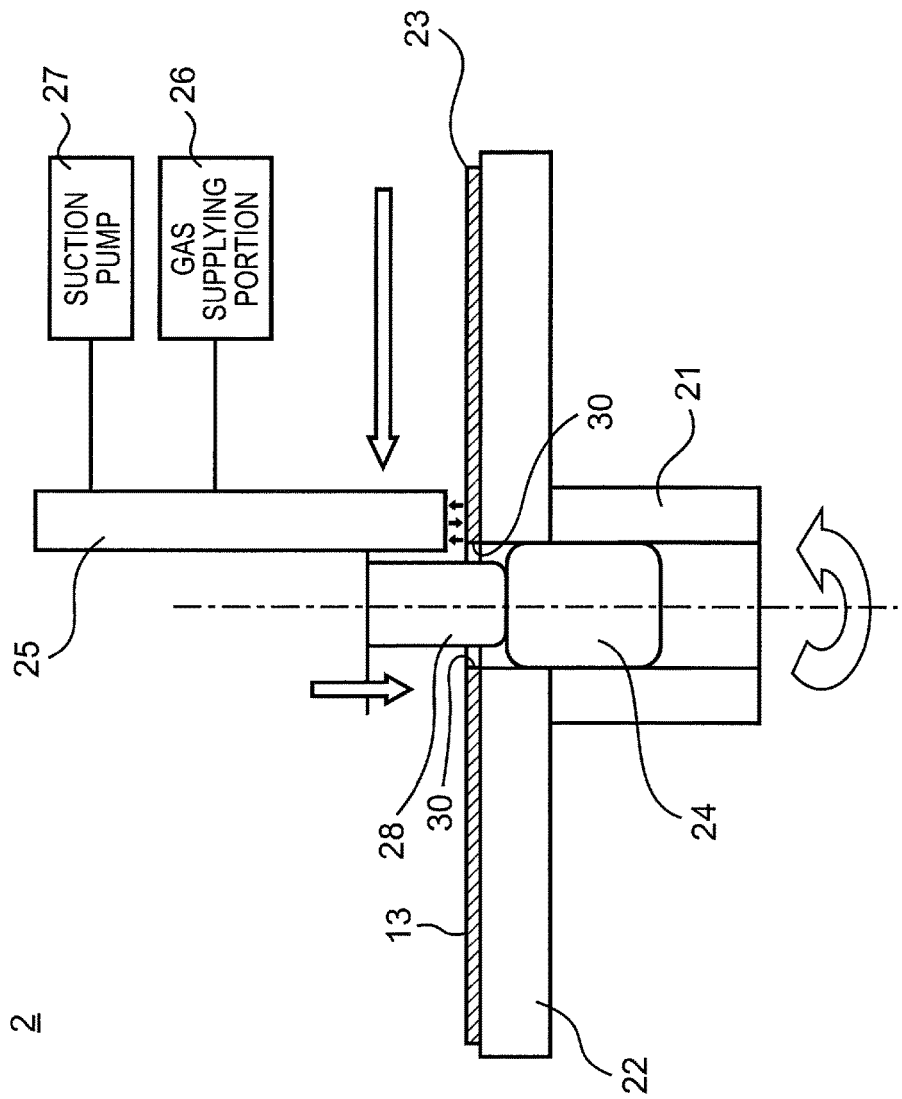
FIG. 4 is a view showing operation to remove the foreign material in the optical recording medium production device according to First Embodiment of the present disclosure.

Next, operation to remove the foreign material of the production device 2 according to the present embodiment will be described. FIG. 4 is a view for describing the operation to remove the foreign material of the optical recording medium production device 2 according to the present embodiment.

First, as shown in FIG. 2, the substrate 23 is placed on the substrate holding portion 22 with reference to the substrate positioning pin 24 and is held by the substrate holding portion 22 by the action such as vacuum suction. In this state, the substrate positioning pin fixing portion 28 presses the substrate positioning pin 24, and mutual positions are fixed by actions of the magnets in this state. At this time, as shown in FIG. 4, the substrate positioning pin fixing portion 28 presses the substrate positioning pin 24, by which the gap (space) is formed between the inner circumferential side surface 30 of the center hole of the substrate 23, and the substrate positioning pin fixing portion 28 and the substrate positioning pin 24. In order to form the gap (space) in this manner, the lateral width of the substrate positioning pin fixing portion 28 is preferably smaller than the diameter of the circular cross section of the substrate positioning pin 24.

Next, the substrate holding portion 22 is rotated by the rotary motion of the rotary shaft 21, and this rotary motion allows the substrate 23 held by the substrate holding portion 22 to be rotated similarly. This rotation of the substrate 23 and the movement in the radial direction of the cleaner nozzle 25 described below may remove the foreign material existing at every position on the upper surface of the substrate 23.

The forefront portion of the cleaner nozzle 25 is translated in the radial direction of the substrate 23 from the center hole vicinity to the outer circumferential vicinity of the substrate 23, or from the outer circumferential vicinity to the center hole vicinity of the substrate 23 at the distance of several millimeters from the signal surface 13 of the substrate 23. When the forefront portion of the cleaner nozzle 25 exists in the center hole vicinity of the substrate 23, the forefront portion preferably approaches the portion slightly closer to the center of the center hole than the inner circumferential side surface 30 of the center hole of the substrate 23.

The forefront portion of the cleaner nozzle 25 simultaneously performs the ejection of the gas and the suction of the gas toward the surface of the substrate 23 to thereby remove the foreign material on the surface of the substrate 23. At this time, the substrate positioning pin fixing portion 28 presses the substrate positioning pin 24, by which the gap (space) is formed between the inner circumferential side surface 30 of the center hole of the substrate 23, and the substrate positioning pin fixing portion 28 and the substrate positioning pin 24, so that the forefront portion of the cleaner nozzle 25 can suction and remove the foreign material near the inner circumferential side surface 30 of the center hole of the substrate 23 sufficiently and efficiently. Furthermore, if the forefront portion of the cleaner nozzle 25 can approach the portion slightly closer to the center hole center than the inner circumferential side surface 30 of the center hole of the substrate 23, the foreign material near the inner circumferential side surface 30 of the center hole of the substrate 23 can be removed more sufficiently and more efficiently.

Moreover, in the optical recording medium production device 2 to remove the foreign material according to the present embodiment, since the substrate positioning pin 24 is fixed by the substrate positioning pin fixing portion 28, each of the mutual contact surfaces is not worn even when the rotary shaft 21 and the substrate holding portion 22 rotate, and thus, the occurrence of the foreign material during the rotary motion of the rotary shaft 21 and the substrate holding portion 22 can be eliminated.

1.3. Conclusion

In the optical recording medium production device 2 according to First Embodiment, the substrate positioning pin fixing portion 28 presses the substrate positioning pin 24, by which the gap (space) is formed between the inner circumferential side surface 30 of the center hole of the substrate 23, and the substrate positioning pin fixing portion 28 and the substrate positioning pin 24. Moreover, the forefront portion of the cleaner nozzle 25 can approach the portion slightly closer to the center hole center than the inner circumferential side surface 30 of the center hole of the substrate 23. These allows the inner circumferential side surface 30 of the center hole of the substrate 23 to be exposed, and the foreign material near the inner circumferential side surface 30 of the center hole of the substrate 23 to be removed sufficiently and efficiently. Furthermore, since the substrate positioning pin 24 is fixed by the substrate positioning pin fixing portion 28, the occurrence of the foreign material, which may be caused by friction of the substrate positioning pin 24 and the substrate positioning pin fixing portion 28 during the rotary motion of the rotary shaft 21 and the substrate holding portion 22, is suppressed.

2. Second Embodiment

2.1. Configuration of Optical Recording Medium Production Device

Figure 5:
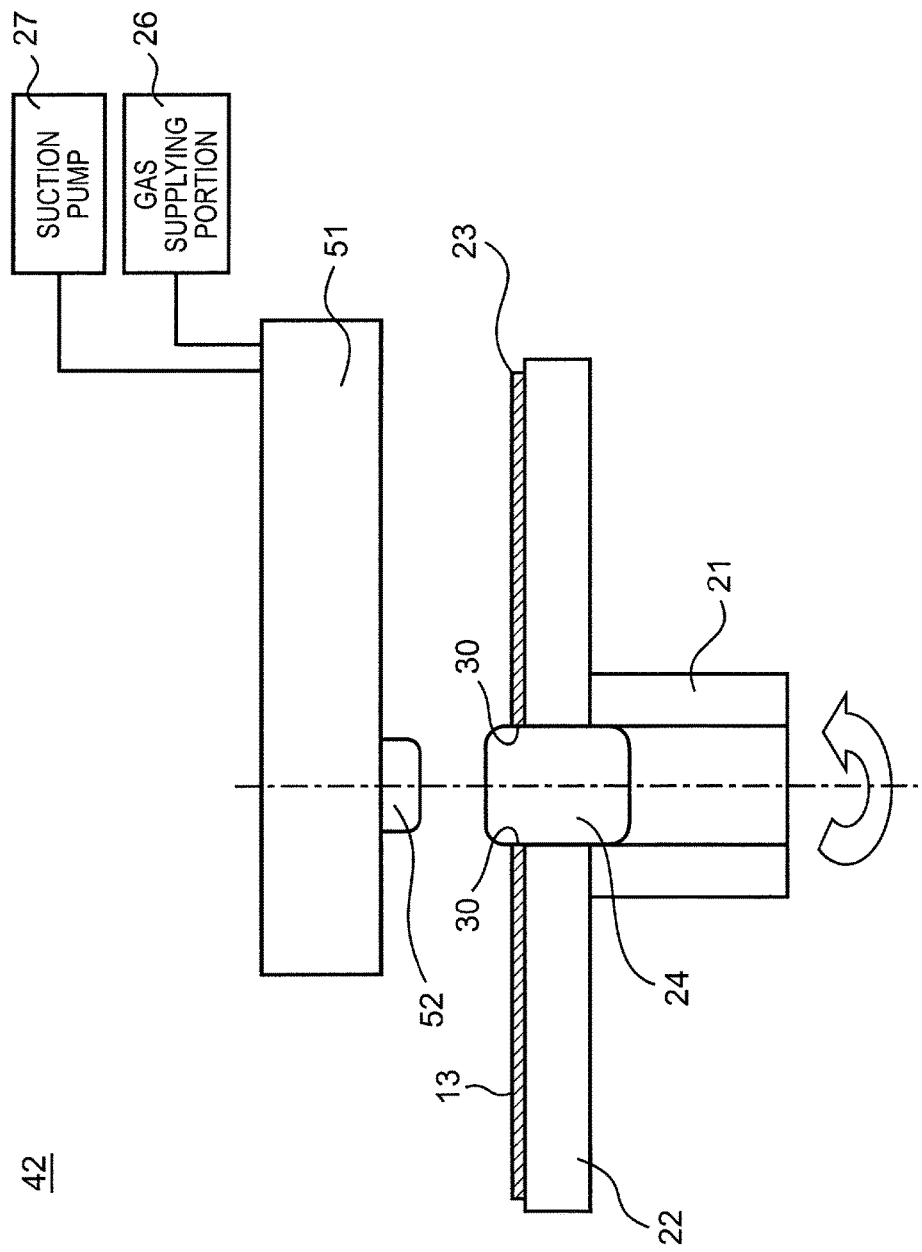
FIG. 5 is a view showing a schematic configuration of an optical recording medium production device to remove a foreign material, according to Second Embodiment of the present disclosure.

A production device according to Second Embodiment of the present disclosure will be described. FIG. 5 is a view showing a schematic configuration of the optical recording medium production device according to the present embodiment. In a production device 42 according to Second Embodiment, since configurations of a rotary shaft 21, a substrate holding portion 22, and a substrate positioning pin 24 are similar to those of First Embodiment, detailed descriptions are omitted. In the following description, the configuration of the production device 42 is also shown when a foreign material of a recording medium is removed immediately before the cover layer process, and in the production device, a substrate 23 in a state after a recording layer and/or a reflection film is formed by sputtering is arranged.

The production device 42 according to Second Embodiment of the present disclosure is different from the production device of First Embodiment of the present disclosure in that a substrate positioning pin fixing portion 52 and a cleaner unit 51 that performs ejection of gas and suction of the gas to remove the foreign material are integrally configured.

Figure 6:
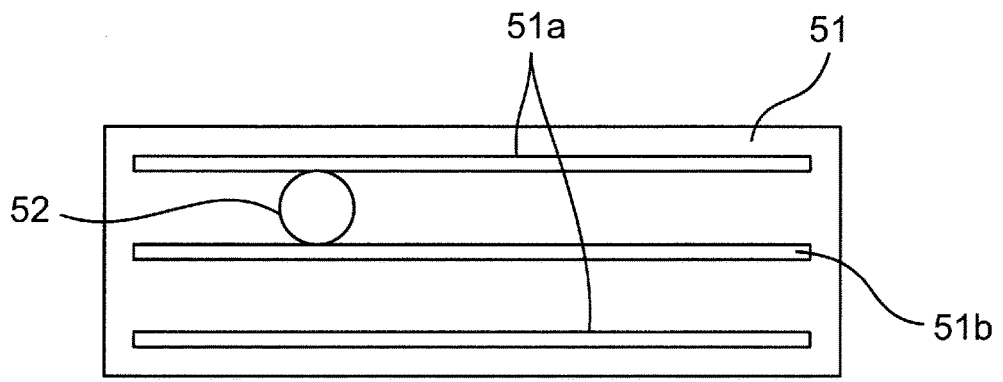
FIG. 6 is a view showing a bottom surface of a cleaner unit opposed to a signal surface of a substrate arranged on a substrate holding portion.

FIG. 6 is a view when the cleaner unit 51 is seen from a side opposed to a signal surface 13 of the substrate 23 arranged on the substrate holding portion 22, that is, from an opening portion side of the cleaner unit 51. The cleaner unit 51 according to Second Embodiment has a schematic rectangular parallelepiped shape, and as shown in FIG. 5, a longitudinal dimension thereof is beyond a radius of the substrate 23.

As shown in FIG. 6, at a bottom surface of the cleaner unit 51 according to Second Embodiment, in order to remove the foreign material more efficiently, one gas ejection portion 51b and two gas suction portions 51a, which each have a slit shape, are arranged in parallel in a longitudinal direction of the cleaner unit 51. The one gas ejection portion 51b is arranged at a center of the bottom surface of the cleaner unit 51, and the two gas suction portions 51b are each arranged near an edge portion of the bottom surface of the cleaner unit 51. Moreover, the substrate positioning pin fixing portion 52 is provided between the gas ejection portion 51b and any one of the gas suction portions 51a. The substrate positioning pin fixing portion 52 may be provided at another position of the bottom surface of the cleaner unit 51, and for example, may be provided at a position in the middle so as to obstruct a part of the slit-shaped gas ejection portion 51b. Moreover, while in the cleaner unit 51 shown in FIG. 6, the one gas ejection portion 51b and the two gas suction portions 51a are provided, a larger number of gas ejection portions 51b and gas suction portions 51a may be provided.

The high-pressure gas ejected onto a surface of the substrate 23 through the gas ejection portion 51b in a bottom surface of the cleaner unit 51 is supplied by a gas supply portion 26 connected to the cleaner unit 51. The gas suctioned from the surface of the substrate 23 through the gas suction portions 51a in the bottom surface of the cleaner unit 51 is suctioned by a suction pump 27 connected to the cleaner unit 51.

The substrate positioning pin fixing portion 52 configured integrally with the cleaner unit 51 is similar to the substrate positioning pin fixing portion 28 in the production device 2 according to First Embodiment. The substrate positioning pin fixing portion 52 vertically descends to be mutually fixed in the state pressing the substrate positioning pin 24. By fixing them to each other in this manner, each of contact surfaces between the substrate positioning pin 24 and the substrate positioning pin fixing portion 52 is not worn even when the rotary shaft 21 and the substrate holding portion 22 rotate, and thus, occurrence of the foreign material during rotary motion of the rotary shaft 21 and the substrate holding portion 22 can be suppressed. Therefore, both the substrate positioning pin 24 and the substrate positioning pin fixing portion 52 are preferably made of magnetic field generating bodies such as magnets. Alternatively, one of the substrate positioning pin 24 and the substrate positioning pin fixing portion 52 may be made of the magnetic field generating body such as a magnet, and the other may be made of a magnetic body.

Moreover, when the substrate positioning pin fixing portion 52 presses the substrate positioning pin 24, a gap (space) is preferably formed inside an inner circumferential side surface 30 of a center hole of the substrate 23, that is, a surface of the inner circumferential side surface 30 is preferably exposed. That is, at this time, preferably, the substrate positioning pin fixing portion 52 does not come into contact with the inner circumferential side surface 30 of the center hole of the substrate 23. For this, a lateral width of the substrate positioning pin fixing portion 52 is preferably smaller than a diameter of a circular cross section of the substrate positioning pin 24. Specifically, preferably, for example, the substrate positioning pin fixing portion 52 has a columnar shape, and a diameter of a circular cross section thereof is smaller than the diameter of the circular cross section of the substrate positioning pin 24.

Moreover, in the state where the substrate positioning pin fixing portion 52 presses the substrate positioning pin 24 to be fixed, the substrate positioning pin fixing portion 52 and the bottom surface of the cleaner unit 51 are configured so that the bottom surface of the cleaner unit 51 is arranged at a distance of several millimeters above the signal surface 13 of the substrate 23.

2.2. Operation of Optical Recording Medium Production Device

Figure 7:
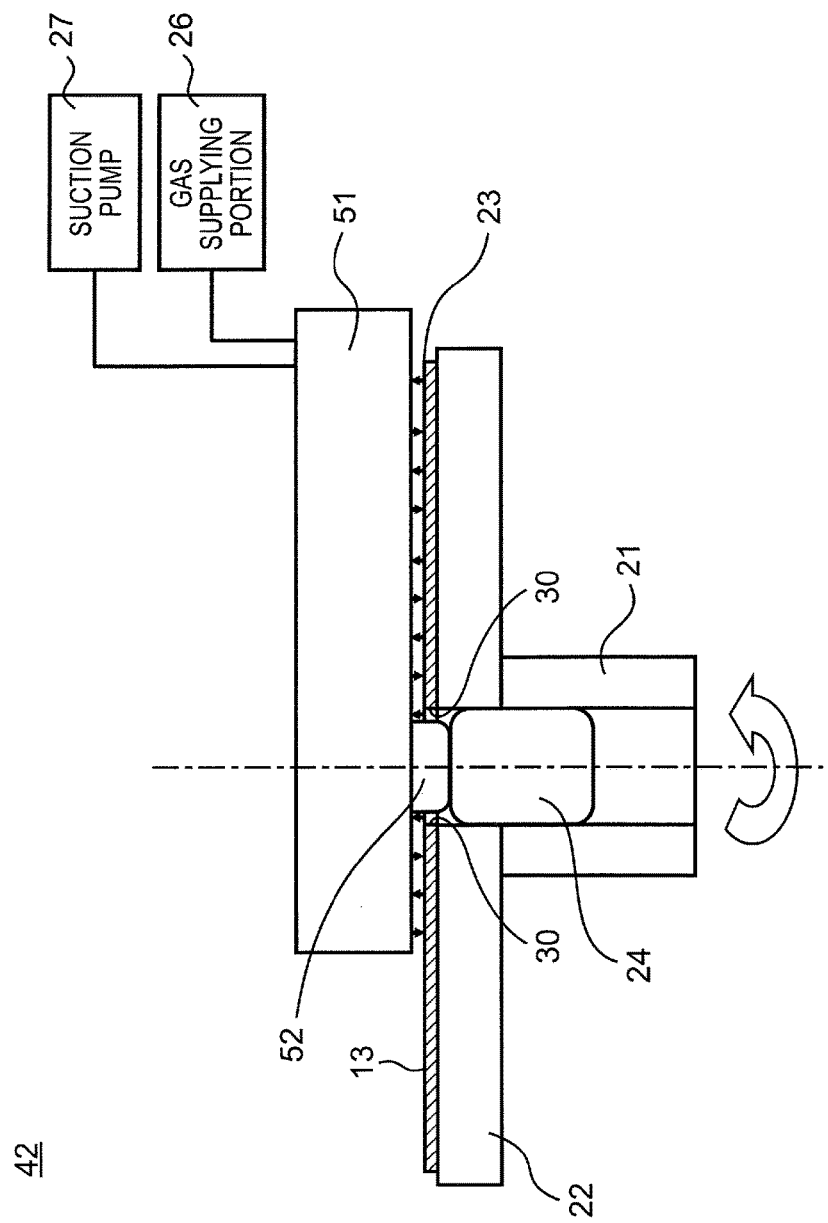
FIG. 7 is a view showing operation to remove the foreign material in the optical recording medium production device according to Second Embodiment of the present disclosure.

Next, operation to remove the foreign material of the production device 42 according to the present embodiment will be described. FIG. 7 is a view for describing the operation to remove the foreign material of the optical recording medium production device 42 according to the present embodiment. Since the operations of the rotary shaft 21, the substrate holding portion 22, and the substrate positioning pin 24 are similar to those in First Embodiment, detailed descriptions are omitted.

First, as shown in FIG. 5, the substrate 23 is placed on the substrate holding portion 22 with reference to the substrate positioning pin 24 and is held by the substrate holding portion 22 by the action such as vacuum suction. In this state, the substrate positioning pin fixing portion 52 configured integrally with the cleaner unit 51 presses the substrate positioning pin 24, and mutual positions are fixed by actions of the magnets in this state. At this time, as shown in FIG. 7, the substrate positioning pin fixing portion 52 presses the substrate positioning pin 24, by which the gap (space) is formed between the inner circumferential side surface 30 of the center hole of the substrate 23, and the substrate positioning pin fixing portion 52 and the substrate positioning pin 24. In order to form the gap (space) in this manner, the lateral width of the substrate positioning pin fixing portion 52 is preferably smaller than the diameter of the circular cross section of the substrate positioning pin 24.

When the substrate positioning pin fixing portion 52 presses the substrate positioning pin 24, and the mutual positions are fixed by the actions of the magnets, the cleaner unit 51 bottom surface is arranged at a distance of several millimeters above the signal surface 13 of the substrate 23.

Next, the substrate holding portion 22 is rotated by the rotary motion of the rotary shaft 21, and this rotary motion allows the substrate 23 held by the substrate holding portion 22 to be also rotated similarly. By this rotation of the substrate 23 and the arrangement of the cleaner unit 51 including, in the bottom suface, the slit-shaped gas ejection portion 51b and the similar slit-shaped gas suction portions 51a, which are longer than the radius of the substrate 23, the foreign material existing at every position of the upper surface of the substrate 23 may be removed.

The gas ejection portion 51b and the gas suction portions 51a in the bottom surface of the cleaner unit 51 are arranged at a distance of several millimeters above the signal surface 13 of the substrate 23. As shown in FIG. 6, since the gas ejection portion 51b and one of the gas suction portions 51a are arranged so as to sandwich the substrate positioning pin fixing portion 52, a part of the gas ejection portion 51b and a part of the gas suction portion 51a in the vicinity of the substrate positioning pin fixing portion 52 are above the position closer to the center of the center hole than the circumferential side surface 30 of the center hole of the substrate 23.

The cleaner unit 51 simultaneously performs the ejection and the suction of the gas to thereby remove the foreign material of the surface of the substrate 23. At this time, the substrate positioning pin fixing portion 52 continues to press the substrate positioning pin 24, by which the gap (space) is formed between the inner circumferential side surface 30 of the center hole of the substrate 23, and the substrate positioning pin fixing portion 52 and the substrate positioning pin 24, so that the gas ejection portion 51b and the gas suction portions 51a of the cleaner unit 51 can suction and remove the foreign material near the inner circumferential side surface 30 of the center hole of the substrate 23 sufficiently and efficiently. Also, since the part of the gas ejection portion 51b and the part of the gas suction portion 51a in the vicinity of the substrate positioning pin fixing portion 52 are immediately above the portion closer to the center of the center hole than the inner circumferential side surface 30 of the center hole of the substrate 23, the foreign material near the circumferential side surface 30 of the center hole of the substrate 23 can be removed more sufficiently and efficiently.

A longitudinal dimension of the cleaner unit 51 may be nearly equal to the diameter of the substrate 23, or may be beyond the diameter of the substrate 23. In these cases, the foreign material can be removed more quickly and more surely.

2.3. Conclusion

Since as in First Embodiment, the optical recording medium production device 2 according to Second Embodiment also enables the space to be formed near the inner circumferential side surface 30 of the center hole of the substrate 23 during cleaning operation, the foreign material near the inner circumferential side surface 30 of the center hole of the substrate 23 may be removed sufficiently and efficiently. Furthermore, since the substrate positioning pin 24 is fixed by the substrate positioning pin fixing portion 52, the occurrence of the foreign material, which may be caused by friction of the substrate positioning pin 24 and the substrate positioning pin fixing portion 52 during the rotary motion of the rotary shaft 21 and the substrate holding portion 22, is suppressed.

Further, in the production device according to Second Embodiment, since a movement mechanism of the cleaner nozzle is not required, the overall configuration of the production device can be simplified as compared with First Embodiment.

3. Other Embodiments

While in the foregoing, First and Second Embodiments of the present disclosure have been described, the present disclosure is not limited to the above-described embodiments.

In both the production device according to First Embodiment and the production device according to Second Embodiment, all of the substrate positioning pin 24, the substrate positioning pin fixing portions 28, 52 are each made of the magnetic field generating body such as the magnet, or one of the substrate positioning pin 24 and the substrate positioning pin fixing portions 28, 52 is made of the magnetic field generating body such as the magnet, and the other is made of the magnetic body. That is, when coming into contact with each other, both are mutually fixed. In this manner, as long as the mutual fixation when both come into contact with each other is realized, for the substrate positioning pin fixing portion, another configuration may be employed.

Figure 8:
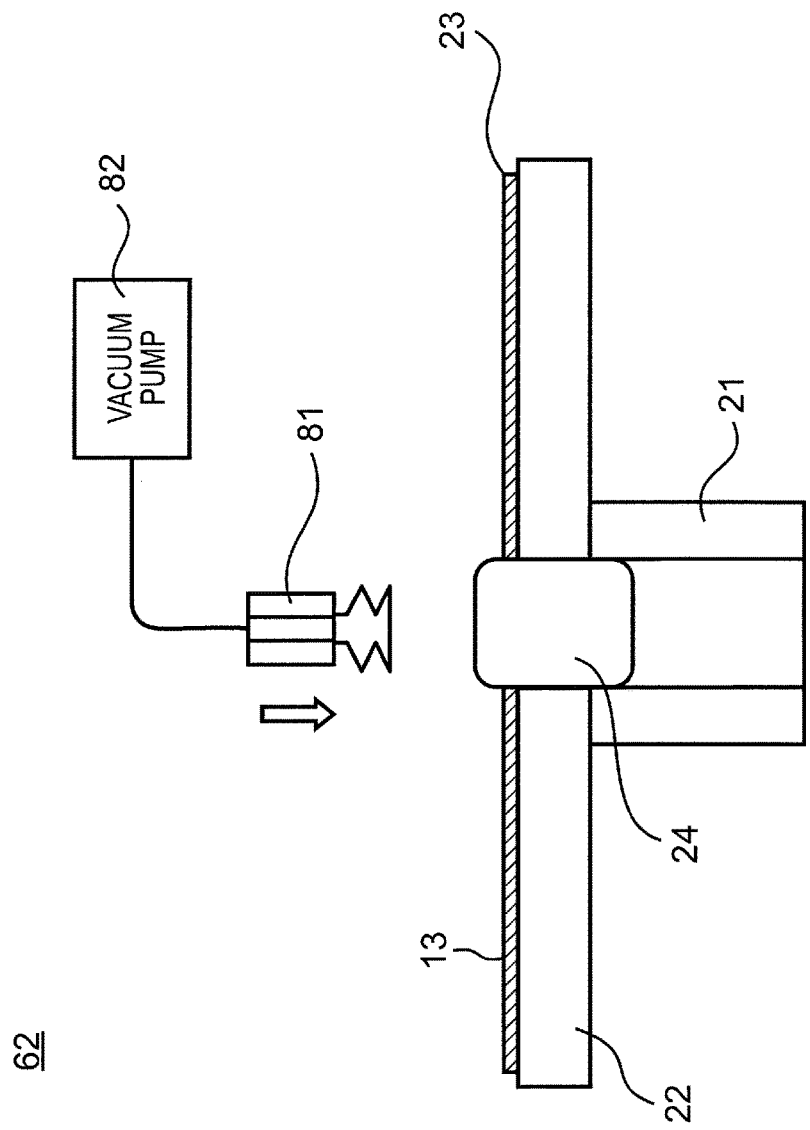
FIG. 8 is a view showing a schematic configuration of a production device of an embodiment of the present disclosure, in which another configuration is employed as a substrate positioning pin fixing portion.

FIG. 8 is a view showing a schematic configuration of a production device 62 according to another embodiment of the present disclosure, in which another configuration is employed as a substrate positioning pin fixing portion 81. The substrate positioning pin fixing portion 81 shown in FIG. 8 is connected to a vacuum pump 82. The substrate positioning pin fixing portion 81 can press a substrate positioning pin 24, and further, in a pressing state, the substrate positioning pin fixing portion 81 can fix the substrate positioning pin 24 while performing vacuum suction by the operation of the vacuum pump 82. With this configuration, each of contact surfaces between the substrate positioning pin fixing portion 81 and the substrate positioning pin 24 is not worn even when a rotary shaft 21 and a substrate holding portion 22 rotate, and thus, occurrence of a foreign material during rotary motion of the rotary shaft 21 and the substrate holding portion 22 can be suppressed.

Although not illustrated, for a cleaner nozzle 25, a gas supply portion 26 and a suction pump 27, those according to First Embodiment shown in FIGS. 2 and 4 are preferably used.

Figure 9:
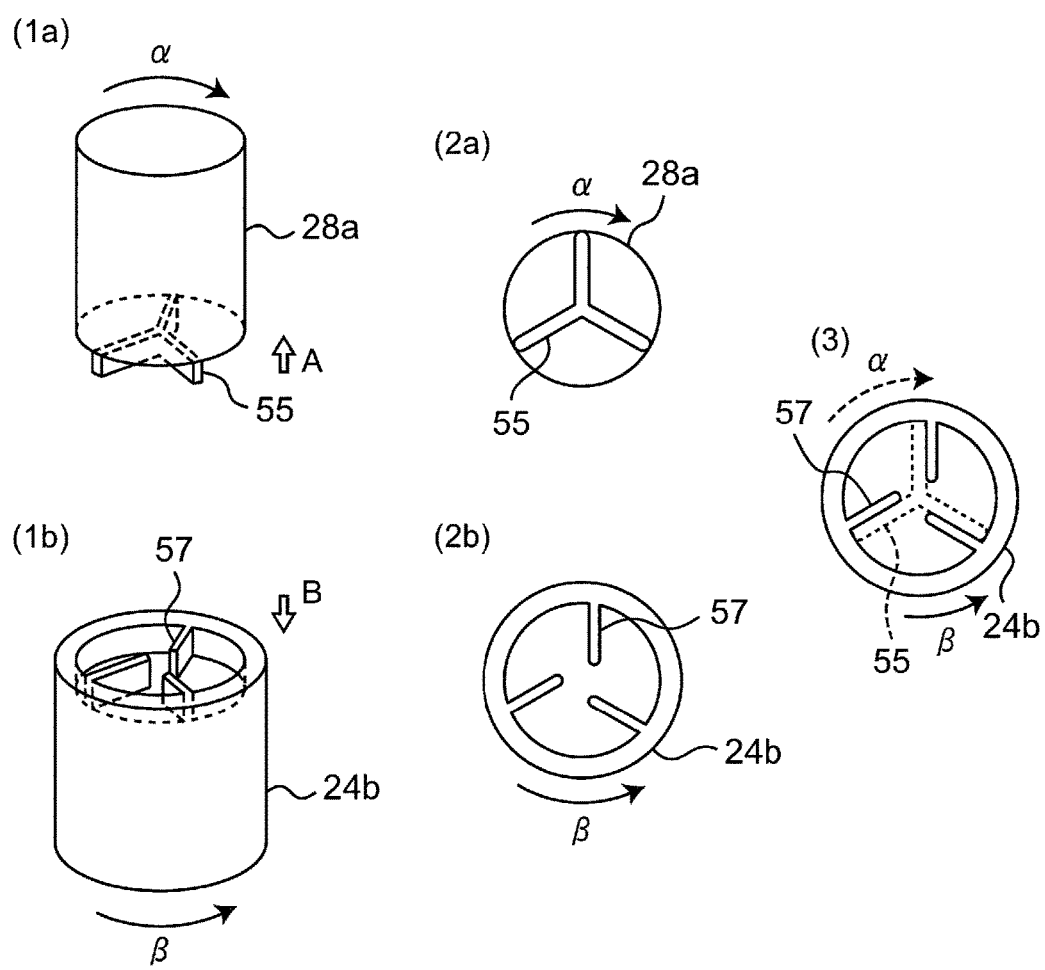
FIG. 9 is view showing a substrate positioning pin and a substrate positioning pin fixing portion that realize one embodiment of the present disclosure.

Moreover, an embodiment of the present disclosure may be realized, even if when the substrate positioning pin fixing portion and the substrate positioning pin come into contact with each other, both are not completely stuck to each other. FIG. 9 is views showing a substrate positioning pin 24b and a substrate positioning pin fixing portion 28a, which realize still another embodiment of the present disclosure. The substrate positioning pin fixing portion 28a has a substantially columnar shape (refer to FIG. 9(1a)), and includes a projected portion 55 having a trident shape at a forefront portion thereof. FIG. 9(2a) shows a bottom view when the substrate positioning pin fixing portion 28a shown in FIG. 9(1a) is seen from arrow A.

The substrate positioning pin 24b also has substantially columnar shape (refer to FIG. 9(1b)), and includes, in an upper surface thereof, a circumferential edge and three tooth-like projected portions 57 that receive and are engaged with the projected portion 55 of the substrate positioning pin fixing portion 28a. FIG. 9(2b) shows a top view when the substrate positioning pin 24b shown in FIG. 9(1b) is seen from arrow B.

Components other than the substrate positioning pin 24*b* and the substrate positioning pin fixing portion 28*a* only need to be similar to those in the production device according to First Embodiment, or in the production device according to Second Embodiment.

When the forefront portion of the substrate positioning pin fixing portion 28*a* and the upper surface of the substrate positioning pin 24*b* are joined and the substrate positioning pin 24*b* is rotated in a direction of rotation arrow β (or the substrate positioning pin fixing portion 28*a* is rotated in a direction of rotation arrow α), mutual positions of the substrate positioning pin fixing portion 28*a* and the substrate positioning pin 24*b* are engaged and fixed, as shown in FIG. 9(3). That is, the projected portion 55 in the forefront portion of the substrate positioning pin fixing portion 28*a* and the tooth-like projected portions 57 in an upper surface of the substrate positioning pin 24*b* are engaged, which prevents both from mutually rotating any more.

In this manner, since the positions in the rotation direction of the substrate positioning pin fixing portion 28*a* and the substrate positioning pin 24*b* are fixed even when a rotary shaft 21 and a substrate holding portion 22 rotate, each of contact surfaces therebetween is not worn, and thus, occurrence of a foreign material during rotary motion of the rotary shaft 21 and the substrate holding portion 22 can be suppressed.

While in the foregoing, the production device according to each of the embodiments of the present disclosure has been described as the device that removes the foreign material of the recording medium immediately before the cover layer process shown in FIG. 1, the production device according to each of the embodiments of the present disclosure can remove a foreign material of the recording medium in the other processes. For example, while in FIG. 1, the sputtering process, the back-surface sputtering process, the printing process and the like included in the overall process of the production of the optical recording medium are shown, the production device according to each of the embodiments of the present disclosure can be also used as a device that removes the foreign material of the recording medium immediately before each of these processes.

EXPLANATION OF REFERENCES

2, 42, 62 production device
11 polycarbonate substrate
12 target material
13 signal surface
14 center cap
15 resin dropping nozzle
16 ultraviolet curable resin
17 back-surface sputtering target
18 water absorption preventing film
21 rotary shaft
22 substrate holding portion
23 substrate
24, 24*b* substrate positioning pin
25 cleaner nozzle
25*a* gas suction nozzle
25*b* gas ejection nozzle
26 gas supply portion
27 suction pump
28, 28*a*, 52, 81 substrate positioning pin fixing portion
30 center hole inner circumferential side surface
51 cleaner unit
51*a* gas suction portion
51*b* gas ejection portion
55 projected portion
57 tooth-like projected portion
82 vacuum pump

The invention claimed is:

1. An optical recording medium production method comprising the steps of:
    holding a substrate positioned by a substrate positioning pin vertically movable to a center hole of the substrate;
    pressing the substrate positioning pin downward and fixing the same so as to expose an inner circumferential side surface of the center hole of the substrate; and
    removing a foreign material by a cleaner that ejects gas toward a surface of the held substrate and simultaneously suctions the gas.

2. The production method according to claim 1,
    wherein in the state where the substrate positioning pin is pressed downward and fixed so as to expose the inner circumferential side surface of the center hole of the substrate,
    a part of the cleaner can move up to an inner position from the inner circumferential side surface of the held substrate.

3. The production method according to claim 1, wherein the respective steps are performed immediately before a process of forming a recording film or a reflection film by sputtering a target material to a signal surface of the substrate.

4. The production method according to claim 1, wherein the respective steps are performed immediately before a process of forming a cover layer to protect a signal surface of the substrate.

5. The production method according to claim 1, wherein the respective steps are performed immediately before a process of forming a water absorption preventing film by sputtering a back-surface sputtering target material to a surface opposite to a surface where a cover layer to protect a signal surface of the substrate is formed.

6. The production method according to claim 1, wherein the respective steps are performed immediately before a process of performing printing to a surface where a water absorption preventing film of the substrate is formed.

* * * * *